US011123977B2

(12) United States Patent
Fisher et al.

(10) Patent No.: US 11,123,977 B2
(45) Date of Patent: Sep. 21, 2021

(54) DISPLACING A SUBSTANCE

(71) Applicant: HEWLETT-PACKARD DEVELOPMENT COMPANY, L.P., Spring, TX (US)

(72) Inventors: Gil Fisher, Ness Ziona (IL); Alex Feygelman, Ness Ziona (IL); Mordechai Arenson, Ness Ziona (IL)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 16/606,213

(22) PCT Filed: Jan. 8, 2018

(86) PCT No.: PCT/US2018/012729
§ 371 (c)(1),
(2) Date: Oct. 17, 2019

(87) PCT Pub. No.: WO2019/135765
PCT Pub. Date: Jul. 11, 2019

(65) Prior Publication Data
US 2020/0324543 A1 Oct. 15, 2020

(51) Int. Cl.
*B41F 31/00* (2006.01)
*B41F 31/26* (2006.01)
*H01L 41/09* (2006.01)

(52) U.S. Cl.
CPC ............ *B41F 31/004* (2013.01); *B41F 31/26* (2013.01); *H01L 41/0993* (2013.01)

(58) Field of Classification Search
CPC ....... B41F 35/04; B41J 29/17; B41P 2235/26; B05B 1/005; B05B 1/1681; B05B 1/1627; B05B 1/16; B08B 5/02
See application file for complete search history.

(56) References Cited

U.S. PATENT DOCUMENTS 3,741,157 A * 6/1973 Krause ............... G03G 21/0052
399/343
5,291,628 A * 3/1994 Thayer ..................... A47L 5/34
15/306.1
(Continued)

FOREIGN PATENT DOCUMENTS

CN 1841091 A 10/2006
CN 101568436 A 10/2009
(Continued)

OTHER PUBLICATIONS

Deganello, et al. "Patterning of micro-scale conductive networks using reel-to-reel flexographic printing." Thin Solid Films 518, No. 21 (2010): 6113-6116.

*Primary Examiner* — Leslie J Evanisko
*Assistant Examiner* — Leo T Hinze
(74) *Attorney, Agent, or Firm* — Brooks Cameron & Huebsch PLLC

(57) ABSTRACT

According to some examples a substance displacement apparatus may comprise a gas ejection aperture and a deflector arm. The gas ejection aperture may be to direct gas towards a roller having a surface on which a substance is disposed. The deflector arm may be moveable between a first position in which gas is directed away from a target area on the surface of the roller, and a second position in which gas is directed towards the target area on the surface of the roller, thereby to displace at least some of the substance from the surface of the roller within the target area. A method and a print apparatus are also disclosed.

14 Claims, 9 Drawing Sheets

(56) References Cited

U.S. PATENT DOCUMENTS

| | | | |
|---|---|---|---|
| 6,522,859 B1 * | 2/2003 | Chappell | G03G 21/0052 15/345 |
| 6,977,013 B2 | 12/2005 | Schroeder et al. | |
| 7,403,732 B2 * | 7/2008 | Shimazu | G03G 15/0258 399/92 |
| 7,417,359 B2 | 8/2008 | Scher et al. | |
| 7,645,547 B2 | 1/2010 | Okuda et al. | |
| 9,141,027 B1 * | 9/2015 | Furuki | G03G 15/0849 |
| 9,156,248 B1 | 10/2015 | Thayer | |
| 9,272,506 B2 | 3/2016 | Stowe et al. | |
| 2012/0291642 A1 | 11/2012 | Barton | |
| 2016/0082716 A1 | 3/2016 | Stowe | |
| 2017/0043590 A1 * | 2/2017 | Fisher | F16K 99/0028 |

FOREIGN PATENT DOCUMENTS

| | | | |
|---|---|---|---|
| CN | 101668636 A | 3/2010 | |
| CN | 102785471 A | 11/2012 | |
| CN | 104040297 A | 9/2014 | |
| CN | 104051674 A | 9/2014 | |
| CN | 105050815 A | 11/2015 | |
| CN | 106573466 A | 4/2017 | |
| JP | WO2009145342 A1 | 10/2011 | |
| WO | WO-2015110179 A1 * | 7/2015 | F16K 11/20 |

\* cited by examiner

DISPLACING A SUBSTANCE

BACKGROUND

In a printing press, a substance, such as print agent, a coating or a varnish may be applied to a plate mounted on a roller for subsequent transfer onto a printable substrate. In some examples, it may be intended that the substance is not to be transferred onto the substrate from a particular portion of the plate, for example to cause a portion of the substrate corresponding to that particular portion of the plate to remain uncoated or unprinted.

If the position of the portion to remain uncoated or unprinted changes, or the shape of the portion changes, then the plate on the roller may be replaced with a different plate having the new intended printing arrangement. However, producing a new plate and replacing the plate on the roller may be costly and time consuming.

BRIEF DESCRIPTION OF DRAWINGS

Examples will now be described, by way of non-limiting example, with reference to the accompanying drawings, in which.

DETAILED DESCRIPTION

Examples in the present disclosure describe apparatus, systems and methods for selectively displacing a substance from a surface, such as a surface of a roller in a printing apparatus, for example.

Figure 1:
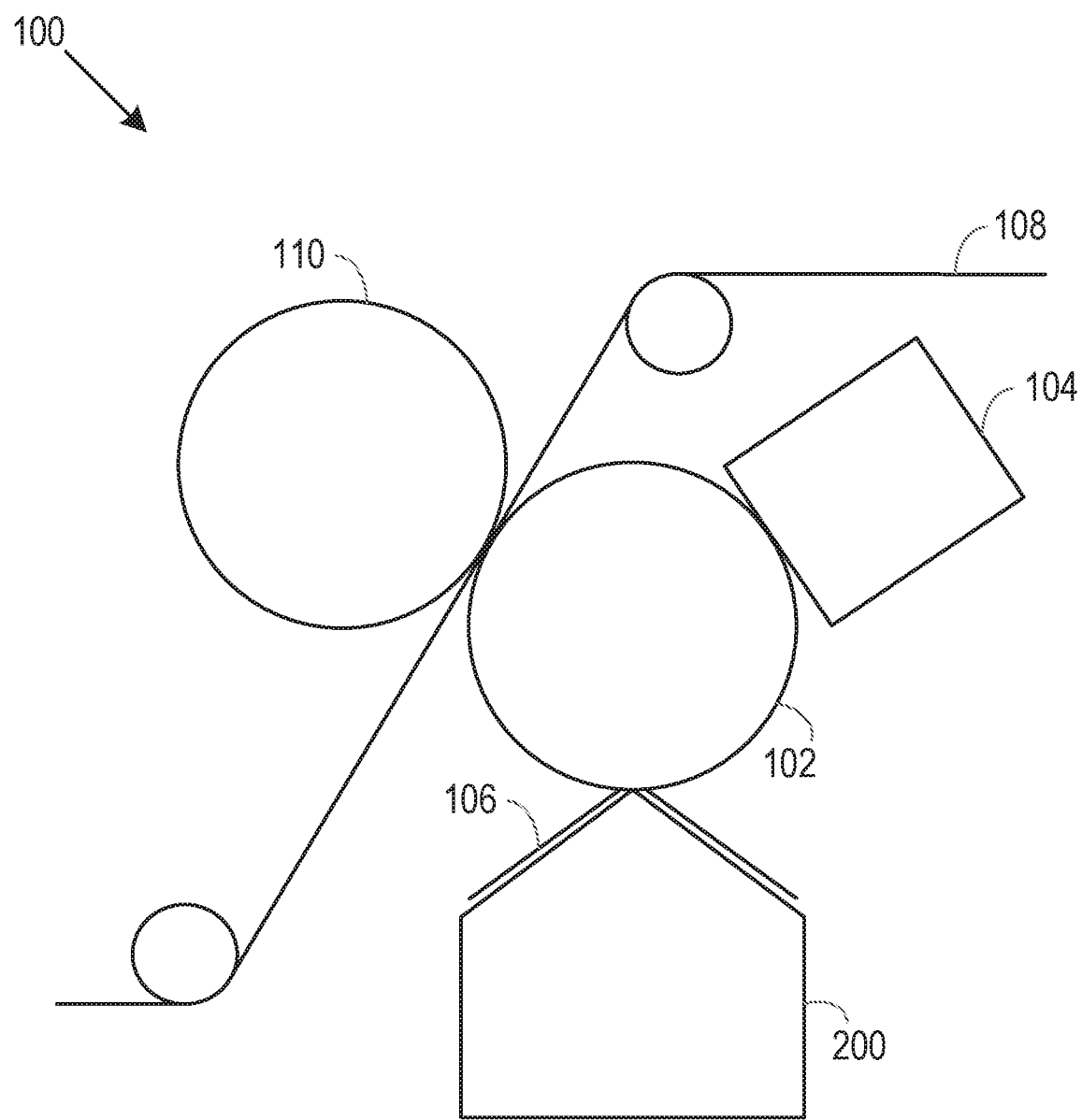
FIG. 1 is a simplified schematic of an example of a printing system.

FIG. 1 shows, schematically, an example of a printing system 100 in which it may be intended to displace substance from a surface of a roller. The printing system 100 may include a first roller 102, such as an anilox roller. An anilox roller may, in some examples, comprise a metallic core surrounded by a ceramic coating. The surface of the ceramic coating may include thousands or millions of indentations, referred to as cells, having a defined capacity. A substance, such as print agent, primer, ink, varnish or the like, may be deposited on the roller, for example from a substance container or source 104. Excess substance may be removed (e.g. scraped) from the surface of the roller using a doctor blade 106 and/or a substance displacement apparatus 200 (discussed in greater detail below). A defined amount of the substance may be left in the cells. The first roller 102 may then be rotated in contact with a printable substrate 108, which may be in the form of individual sheets or a web (as shown in the example of FIG. 1). In some examples, the system 100 may further include a second roller 110, such as a nip roller, which rotates in an opposite direction to the first roller 102, and which serves to urge the printable substrate 108 towards the first roller while print agent is transferred from the first roller onto the printable substrate. In some examples, the second roller 110 may be omitted or replaced with some other component, such as a support to support the printable substrate 108.

During some printing jobs, it may be intended to prevent any substance from being deposited onto a particular area or region of the printable substrate 108, or at least restrict the amount of substance deposited onto the particular area or region. For example, when printing a web or net to be formed into a packaging container, such as a carton for food or drink, it may be intended that some parts of the carton (e.g. attachment tabs) are to be glued and stuck to other parts of the packaging web and, therefore, should not receive any print agent. In other examples, such a packaging web may be coated in a waterproof coating or varnish. Again, it may be intended that some portions of the packaging, such as the tabs, are not to be coated by the varnish or coating. In another example, it may be intended that a region on the packaging web is to remain unprinted (referred to as a knockout), so that a "use by" or "best before" date may be printed subsequently in that region. In such examples, in order to prevent substance (e.g. ink or varnish) from being deposited onto the printable substrate 108, the print agent may be removed or displaced from those cells on the anilox roller 102 which correspond to the region to remain unprinted or uncoated. As discussed in detail below, the substance displacement apparatus 200 serves to selectively remove or displace a substance from a region or regions on the roller 102.

While the example system 100 discussed above includes an anilox roller 102, in other examples, rollers of other types may be included in the system instead of, or in addition to, the anilox roller. For example, the substance displacement apparatus 200 may remove print agent from the surface of a roller other than an anilox roller, which is intended to be used to transfer print agent (or some other substance) onto a printable substrate 108.

In general, the substance displacement apparatus 200 uses a flow of gas to displace a substance, such as print agent or varnish or the like, from a surface of a roller. Various gases or combinations of gases may be used, such as compressed air, carbon dioxide, nitrogen, or the like. In some examples, high humidity compressed air may be used as this may reduce the drying effect of water-based substances. In order to achieve accurate control over the flow of the gas and, therefore, over the regions on the roller at which the gas is directed, the substance displacement apparatus 200 uses a mechanism for deflecting the flow of gas into an intended direction.

Figure 2:
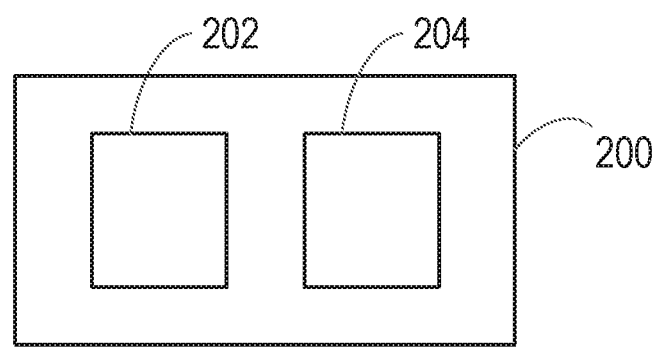
FIG. 2 is a simplified schematic of an example of a substance displacement apparatus.

FIG. 2 is a simplified schematic of an example of the substance displacement apparatus 200. The substance displacement apparatus 200 comprises a gas outlet, or gas ejection aperture 202, to direct gas towards a roller having a surface on which a substance is disposed; and a deflector arm moveable between a first position in which gas is directed away from a target area on the surface of the roller, and a second position in which gas is directed towards the target area on the surface of the roller, thereby to displace at least some of the substance from the surface of the roller within the target area. In some examples, the roller may comprise a roller such as the anilox roller 102. Thus, in general, when it is intended to direct gas towards the surface of the roller so as to displace the substance from the roller surface in a particular area, the deflector arm may be positioned such that the flow of gas is towards the particular area on the roller surface. However, when it is not intended for the flow of gas to be directed towards the particular area on the roller (e.g. when it is intended for the substance to remain on the surface of the roller in that particular area), then the deflector arm may be positioned such that the gas flow is not towards the particular area on the roller surface, or is prevented from reaching the particular area of the roller surface.

Figure 3:
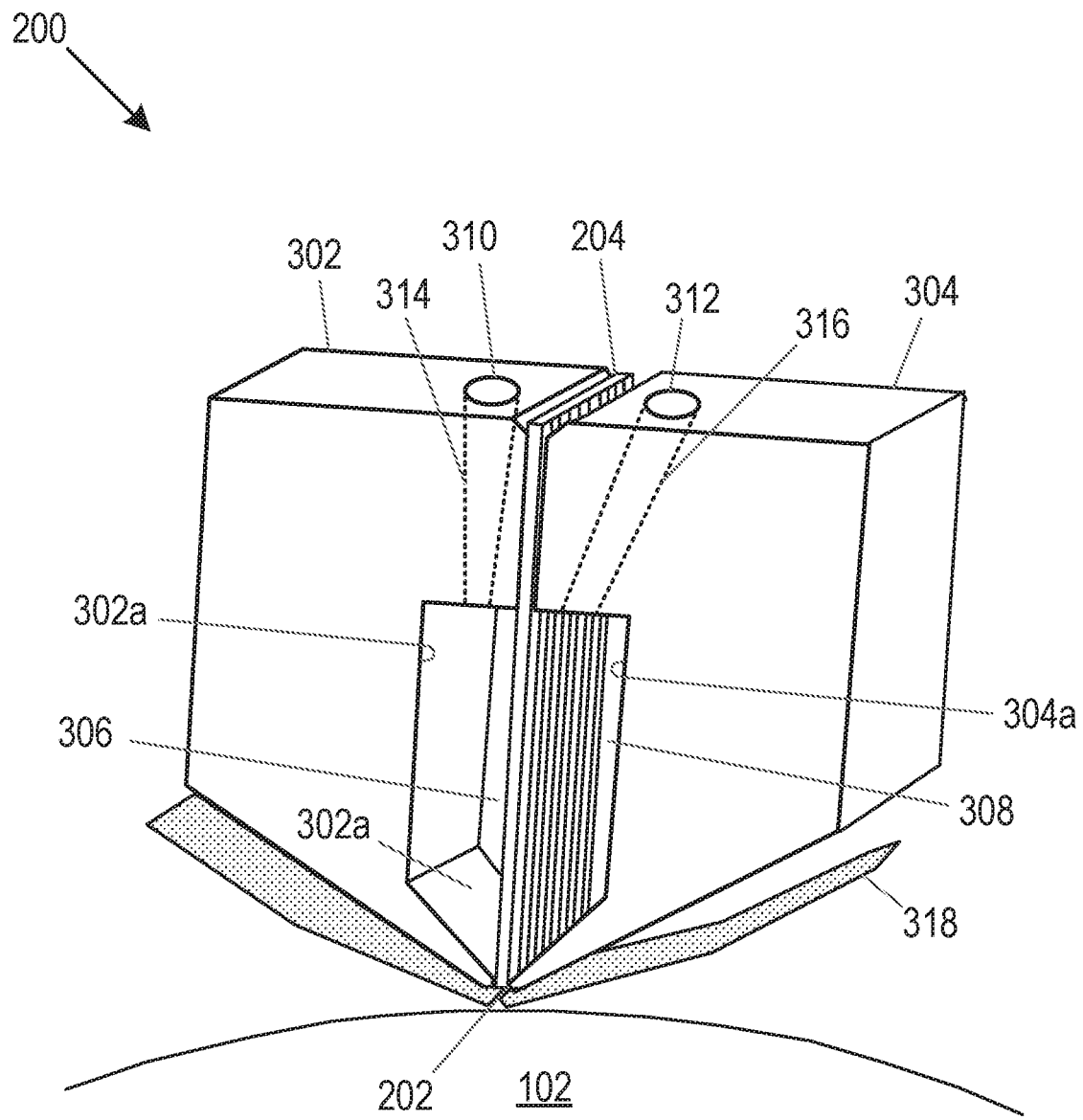
FIG. 3 is a simplified schematic of a further example of a substance displacement apparatus.

FIG. 3 shows, schematically, a cross-section through one particular example of the substance displacement apparatus 200. In the example shown in FIG. 3, the gas ejection aperture 202 is located between a first housing portion 302 and a second housing portion 304. The deflector arm 204 extends into the gas ejection aperture 202 between the first and second housing portions 302, 304. In some examples, the deflector arm 204 may at least partially through the gas ejection aperture 202 between the first and second housing portions 302, 304.

In some examples, the substance displacement apparatus 200 may also include a chamber either side of the deflector arm 204, each chamber to hold gas prior to ejection by the gas ejection chamber 202. In the example shown in FIG. 3, the substance displacement apparatus 200 includes a first chamber 306 and a second chamber 308. The chambers 306, 308 may be of any shape. In the example shown in FIG. 3, the chambers 306, 308 are defined by internal side walls 302a, 304a of the first and second housing portions 302, 304 respectively, the deflector arm 204 and front and back walls (not shown) of the first and second housing portions. In some examples, gas may be received in the first and second chambers 306, 308 through respective gas inlets 310, 312. In this example, the gas inlets 310, 312 are in communication with the first and second chambers 306, 308 respectively via conduits 314, 316. The conduits may be formed through the first and second housing portions 302, 304. Gas may travel from the chambers 306, 308, through the gas ejection aperture 202, towards the roller 102. However, as is clear from the discussion below, in some examples, the deflector arm 204 may restrict or prevent the flow of gas from one of the first and second chambers 306, 308, depending on its position.

The substance displacement apparatus 200 may, in some examples, also comprise a gas guide element 318 and/or a substance guide element 320. Details and functionality of the gas guide element 318 and the substance guide element 320 are discussed below.

Figure 4:
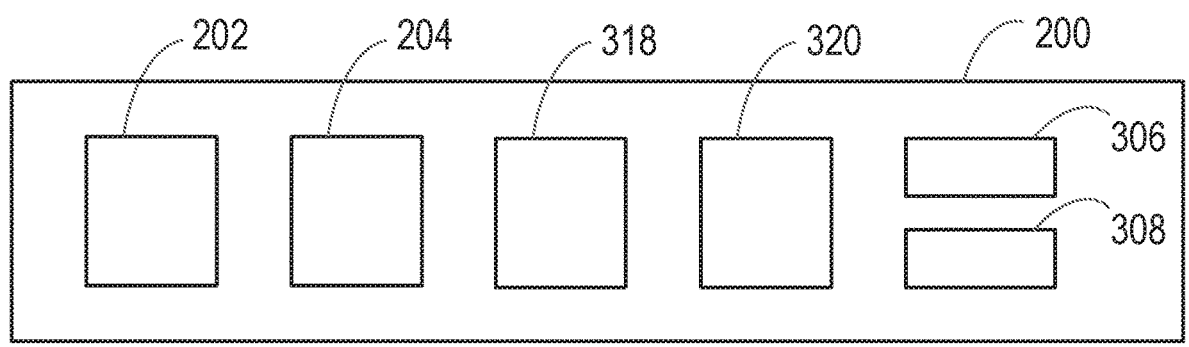
FIG. 4 is a simplified schematic of a further example of a substance displacement apparatus.

FIG. 4 is a simplified schematic of an example of the substance displacement apparatus 200. In the example shown in FIG. 4, the substance displacement apparatus 200 includes the gas ejection aperture 202 and the deflector arm 204. The apparatus 200 may further comprise the gas guide element 318. The gas guide element 318 may be positioned relative to the gas ejection aperture 202 to guide gas which is directed away from the target area away from the roller. In some examples, the apparatus 200 may further comprise the substance guide element 320. The substance guide element 320 may be positioned relative to the gas ejection aperture 202 to guide gas which is directed towards the target area, and the substance removed from the target area, away from the roller. In some examples, the substance displacement apparatus 200 may further comprise the first chamber 306 and the second chamber 308. The chambers 306, 308 may be either side of the deflector arm 204, each chamber to hold gas prior to ejection via the gas ejection aperture 202.

Figure 5:
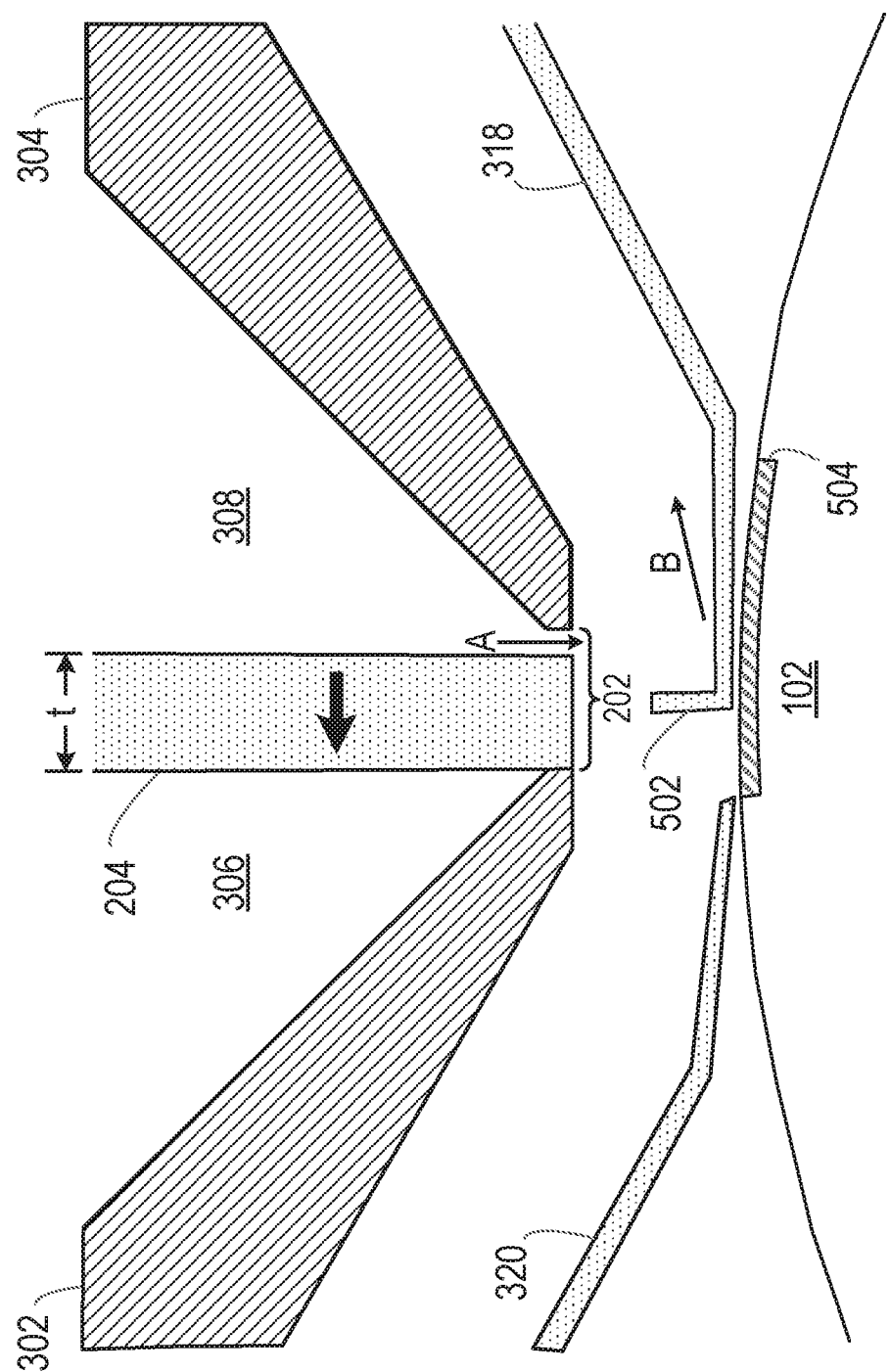
FIG. 5 is a simplified schematic of an example of a portion of a substance displacement apparatus in a first configuration.
Figure 6:
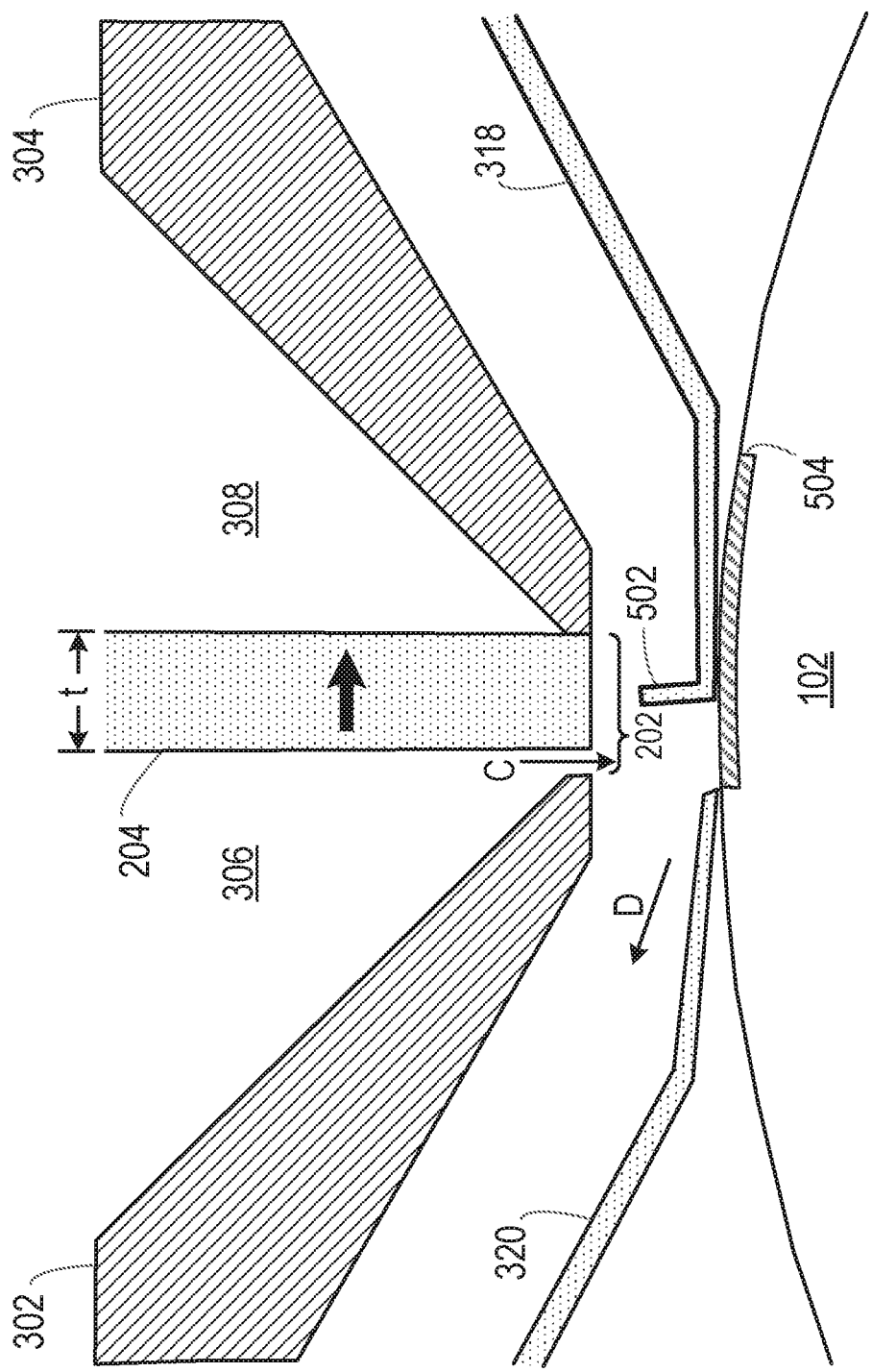
FIG. 6 is a simplified schematic of an example of the portion of the substance displacement apparatus in a second configuration.

FIGS. 5 and 6 are simplified schematics of a portion of the substance displacement apparatus 200 shown in FIG. 3, with the deflector arm 204 in the first position and the second position respectively. In FIG. 5, the deflector arm 204 is shown in the first position which, in this example, is to the left-hand side of the gas ejection aperture 202. In other examples, the positions may be reversed, such that, in the first position, the deflector arm 204 is to the right-hand side of the gas ejection aperture 202. Thus, the deflector arm 204 may touch the first housing member 302 at the location of the gas ejection aperture 202, and may be spaced apart from the second housing member 304. In this way, while the deflector arm 204 is in the first position, gas from the first chamber 306 may be prevented from exiting the first chamber through the gas ejection aperture 202, while gas from the second chamber 308 may be able to exit the second chamber through the gas ejection aperture, as indicated by arrow A.

In FIG. 5, the roller 102 is shown located below the substance displacement apparatus 200. However, in other examples, the roller 102 and the apparatus 200 may be arranged in any orientation about one another. For example, the apparatus 200 may be positioned below the roller 102, as shown in the example arrangement of FIG. 1. It will be apparent that, since the roller 102 rotates with respect to the apparatus 200 in use, the target area on the roller surface will also move relative to the apparatus. Therefore, in order to displace a substance from the surface of the roller 102 within a target area 504, gas may be ejected through the gas ejection aperture 202 towards the roller for a duration that it takes for the whole target area to pass under the part of the gas ejection aperture through which gas is ejected.

The gas ejection aperture 202 may be positioned such that gas flowing from the first and/or second chambers 306, 308 is directed at least initially to towards the roller 102. In the example of FIG. 5, gas that is able to flow from the second chamber 308 through the gap formed between the deflector arm 204 and the second housing member 304 is directed onto the gas guide element 318. In some examples, the gas guide element 318 may comprise a lip 502 to prevent gas which is directed away from the target area from flowing towards the target area after ejection. In other words, the lip 502 may prevent the flow of gas (or at least most of the gas flow) ejected from the second chamber 308 from reaching the target area. The lip 502 deflects any gas ejected from the second chamber 308 away from the target area, generally in the direction indicated by arrow B. In some examples, the gas guide element 318 guides the flow of gas along an outer surface of the second housing member 304. The gas may, in some examples, then be recycled, or ejected into the atmosphere.

In other examples, the gas guide element 318 may not include a lip, but the gas may be directed away from the target area 504 in some other way. In some examples, a shape or configuration of the substance displacement apparatus 200 may cause gas to be directed away from the target area 504. For example, the gap formed between the deflector arm 204 and the second housing member 304 may be defined by portions of the apparatus 200 that are shaped and/or angled such that the gas is directed away from the target area. In some examples, a suction mechanism, or vacuum forming mechanism may be used to suck ejected gas away from the apparatus, and/or the roller 102. Such a suction mechanism may form part of the apparatus 200, or may be associated therewith.

In FIG. 6, the deflector arm 204 is shown in the second position which, in this example, is to the right-hand side of the gas ejection aperture 202. In this position, the deflector arm 204 is touching the second housing member 304 at the location of the gas ejection aperture 202, and is spaced apart from the first housing member 302. In this way, while the deflector arm 204 is in the second position, gas from the second chamber 308 is prevented from exiting the second chamber through the gas ejection aperture 202, while gas from the first chamber 306 is able to exit the first chamber through the gas ejection aperture, as indicated by arrow C.

In this example, gas flowing through the gap formed between the deflector arm 204 and the first housing member 302 is directed onto the surface of the roller 102. Thus, when the deflector arm 204 is in the second position, gas may be ejected from the first chamber 306, towards the target area 504 of the roller 102, so as to displace a substance from the target area of the roller. Gas ejected from the apparatus 200 may flow at a rate depending on the intended use (e.g. the nature and amount of substance intended to be displaced). In some examples, the rate of flow of gas from the apparatus 200 may depend on the pressure of gas in the first and second chambers 306, 308. The rate of flow of gas from the apparatus 200 may be variable. In some examples, the rate of flow of gas from the apparatus 200 may be sufficient to displace the substance from the roller 102.

As noted above, gas ejected from the apparatus 200 while the deflector arm 204 is in the second position (as shown in FIG. 6) is directed at least initially towards the target area 504 of roller 102. The ejected the gas and/or substance which has been displaced from the surface of the roller 102 (and from any cells present in the surface of the roller) may be directed away from the roller by the substance guide element 320. The substance guide element 320 may, in some examples, direct substance and/or gas away from the roller 102 along a path formed between the substance guide element and an outer surface of the first housing member 302, generally in the direction indicated by arrow D. In the example shown in FIG. 6, the lip 502 of the gas guide element 318 may prevent the flow of gas and/or substance ejected from the first chamber 306 from flowing into the channel formed by the gas guide element 318 and the second housing member 304. In this way, the lip 502 may serve as a barrier to help to deflect substance and/or gas in the direction of the arrow D. Again, in some examples, a suction mechanism, or vacuum forming mechanism may be used to suck ejected gas away from the apparatus, and/or the roller 102. Such a suction mechanism may form part of the apparatus 200, or may be associated therewith.

In some examples, a thickness t of the deflector arm 204 may be fractionally smaller than a width of the gas ejection aperture 202. In this way, wherein the deflector arm 204 is in contact with one of the first or second housing members 302, 304, the gap formed between the deflector arm and the opposing housing member is relatively small, but large enough to allow the gas to flow therethrough. In some examples, the deflector arm 204 may extend at least partially through the gas ejection aperture 202. A gap through which the gas is directed may, in some examples, have a width of less than approximately 100 micrometres. In some examples, the gap may have a width of between approximately 50 micrometres and 100 micrometres. In other examples, the gap through which the gas is directed may have a larger width. However, a smaller width may cause the gas to be ejected at a greater rate, thereby improving the substance displacement.

In use, the deflector arm 204 may be moved between the first position (shown in FIG. 5) and the second position (shown in FIG. 6) to cause gas to flow onto the surface of the roller 102 in the target area 504, as intended. For example, when it is intended that any substance on the surface of the roller 102 is to remain (i.e. not be displaced), and therefore be transferred onto the printable substrate 108, then the deflector arm 204 may be moved into the first position. In this way, gas from the second chamber 308 may be caused to exit the second chamber through the gap formed between the deflector arm 204 and the second housing member 304, and deflected away from the roller 102, without any substance being displaced from the roller surface. If it is intended that a particular portion of the printable substrate 108 is to remain unprinted or uncoated, then the deflector arm 204 may be moved into the second position. In this position, gas from the first chamber 306 is caused to exit the first chamber through the gap formed between the deflector arm 204 and the first housing member 302, towards the target area 504 of the roller 102. As the roller 102 rotates, the gas is directed towards the roller surface, thereby causing any substance on the surface to be displaced in the direction of the arrow D. In this way, when the target area 504 of the roller 102 comes into contact with the printable substrate 108, no substance will be transferred onto the printable substrate from the target area. Once the roller 102 has rotated through the extent of the target area 504, the deflector arm 204 may be moved into the first position, so as to prevent any further substance from being displaced from the roller surface.

The deflector arm 204 may be moved between the first position in the second position in a number of ways. In some examples, the deflector arm may be formed from a piezoelectric material. A piezoelectric material is a material that exhibits the piezoelectric effect (or the reverse piezoelectric effect), whereby a mechanical strain is generated in the material in response to the application of an electric field (e.g. a voltage) through the material. Thus, in some examples, the deflector arm 204 may be formed from such a piezoelectric material, such that, when no electric field is applied through the deflector arm, the deflector arm is in the first position and, when an electric field is applied through the deflector arm, a mechanical strain is generated, causing the deflector arm to move into the second position. When the electric field is removed, the deflector arm 204 may be caused to move back into the first position.

In some examples, the deflector arm 204 may be substantially planar in shape. In other words, the deflector arm may have a sheet-like configuration. The width of the deflector arm may, in some examples, depend on the intended resolution at which the substance displacement apparatus 200 is to displace substance from the roller 102. For example, the smallest area on the surface of a roller that could be displaced by a deflector arm 204 having a width of 1 cm would have a width of 1 cm (and a length determined by the duration that the deflector arm remains in the second position). However, by forming the deflector arm 204 such that it has a smaller width, an area on the surface of the roller from which substances to be displaced may be smaller. In some examples, the intended resolution may be less than approximately 2 mm. For example, the resolution may, in some examples, be approximately 1 mm or 0.5 mm. Thus, in such examples, the width of each deflector arm 204 may be 2 mm, 1 mm or 0.5 mm. In other examples, the deflector arm may have a larger width.

In some examples, multiple deflector arms 204 may be arranged adjacent to one another (e.g. side-by-side). This may increase the width of the area on the surface of the roller 102 from which substance may be displaced. In some examples, the substance displacement apparatus 200 may include multiple deflector arms 204, each having a relatively small width, such that the precise area or areas on the surface of the roller in which substances to be displaced may be accurately selected and/or controlled. An example of the use of multiple deflector arms 204 is shown in the example of FIG. 3. In that example, the deflector arm 204 may be considered to be a deflector arm array, formed of multiple individual deflector arms arranged side by side. Such a deflector arm array is shown more clearly in FIG. 7.

Figure 7:
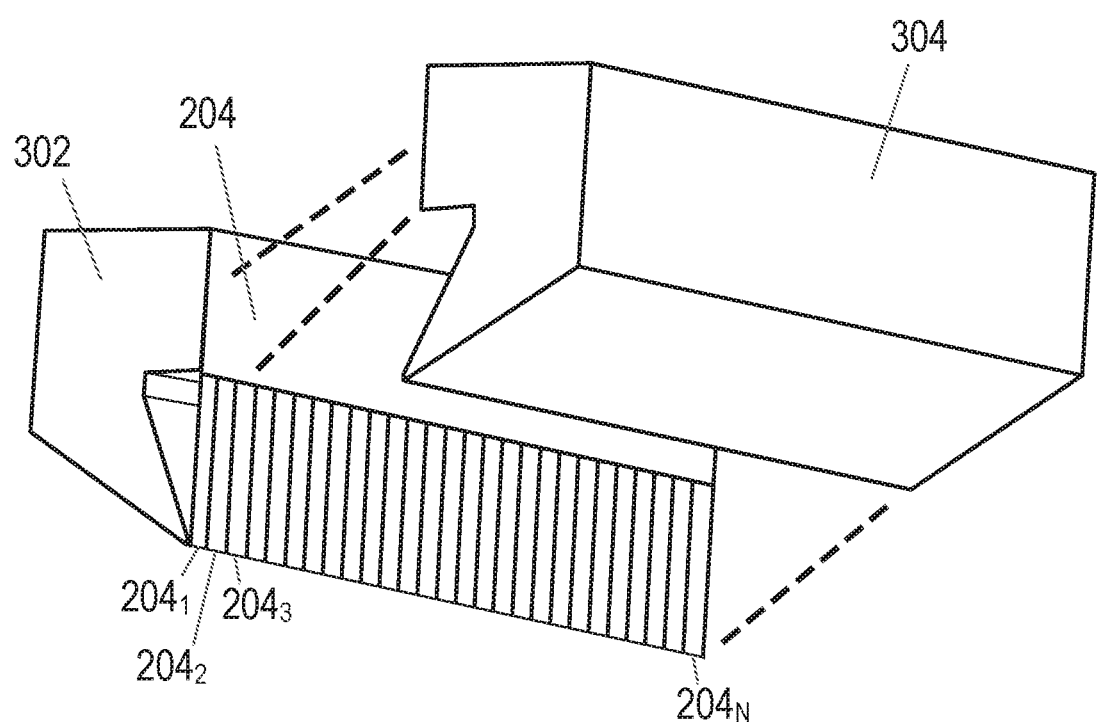
FIG. 7 is a simplified schematic of a further example of a substance displacement apparatus.

FIG. 7 is an exploded perspective view of an example of the substance displacement apparatus 200. In this example, the first housing member 302 is shown in its normal position relative to the deflector arm 204, while the second housing member 304 shown in an exploded manner, separated from the deflector arm. According to this example, the deflector arm 204 may include an electrical contact portion 702 and a plurality of deflector arm elements $204_1$ to $204_N$. The electrical contact portion 702 of the deflector arm 204 may receive an electrical current corresponding to one of the deflector arm elements. In some examples, the electrical contact portion 702 of the deflector arm 204 may receive an electrical current corresponding to multiple deflector arm elements. In some examples, the electrical contact portion 702 may comprise multiple electrical contact portions. For example, the electrical contact portion 702 may comprise an individual electrical contact portion for each deflector arm element $204_1$ to $204_N$. In this way, the movement of each deflector arm element between the first position in second position may be independently controlled.

Figure 8:
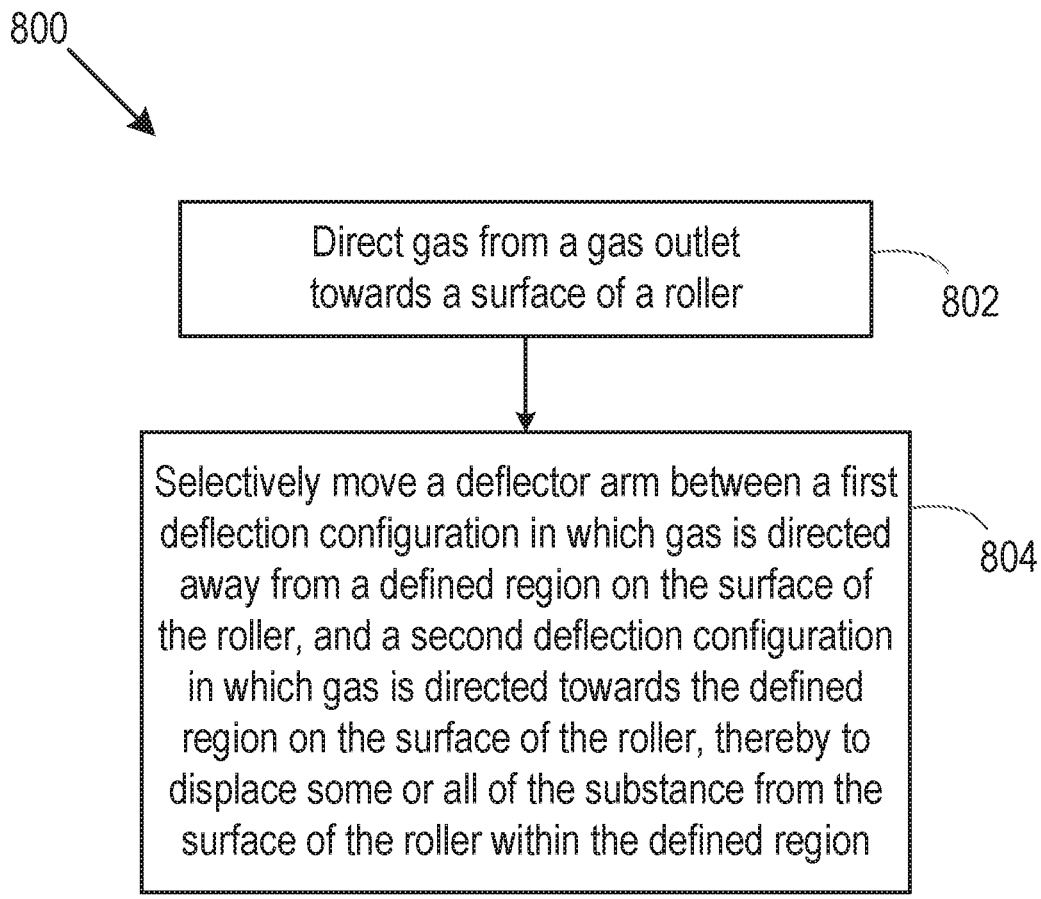
FIG. 8 is a flowchart of an example of a method for displacing a substance.

The present disclosure also relates to method for displacing a substance. FIG. 8 is a flowchart of an example of a substance displacement method 800. The method 800 comprises, at block 802, directing gas from a gas outlet 202 towards a surface of a roller 102, the surface having a substance disposed thereon. At block 804, the method 800 comprises selectively moving a deflector arm 204 between a first deflection configuration in which gas is directed away from a defined region on the surface of the roller, and a second deflection configuration in which gas is directed towards the defined region on the surface of the roller, thereby to displace some or all of the substance from the surface of the roller within the defined region. The method 800 may, in some examples, be performed by, or using, the substance displacement apparatus 200 discussed above.

By displacing a substance from the surface of a roller using the methods disclosed herein, the positioning of the substance on a printable substrate can be accurately controlled and selected. The disclosed methods provide a digital alternative to previous methods, in which a plate mounted on the surface of the roller would be replaced when the removal of substance from a particular area was intended.

Figure 9:
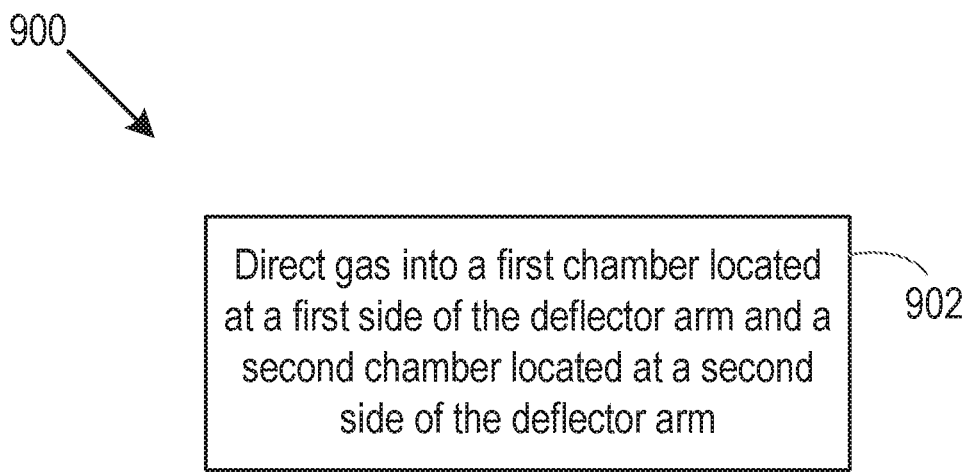
FIG. 9 is a flowchart of a further example of a method for displacing a substance.

FIG. 9 is a flowchart of a further example of a substance displacement method 900. The method 900 may comprise, at block 902, directing gas into a first chamber 306 located at a first side of the deflector arm and a second chamber 308 located at a second side of the deflector arm 204, the first and second chambers to store the gas prior to being directed from the gas outlet 202.

In some examples, gas is directed into the first and second chambers 306, 308 so as to maintain a gas pressure in the first chamber 306 which is approximately equal to a gas pressure in the second chamber 308. In some examples, the approximately equal pressures in the first and second chambers 306, 308 may be achieved by maintaining a flow of gas into the first chamber when the deflector arm 204 is in such a position or configuration that gas is able to exit the first chamber via the gas outlet 202, and by maintaining a flow of gas into the second chamber when the deflector arm is in such a position or configuration that gas is able to exit the second chamber via the gas outlet. In other words, while the substance displacement apparatus 200 is in use, a constant flow of gas may be provided to the first chamber 306 and/or the second chamber 308. By maintaining an approximately equal, stable pressure in the first and second chambers 306, 308, the deflector arm 204 is not caused to move (e.g. between the first and second deflection configurations) as a result of a difference in pressure. Furthermore, with approximately equal gas pressure in both the first and second chambers 306, 308, the deflector arm 204 may be moved between the first and second deflection configurations with the application of a relatively low force. Thus, when the deflector arm 204 is formed from a piezoelectric material, movement between the first and second deflection configurations may be achieved using a relatively small power.

In some examples, the pressure of gas in the first chamber 306 and/or second chamber 308 may be approximately 5 bar. In some examples, the pressure in the chambers may be higher or lower than approximately 5 bar.

As noted above, the deflector arm 204 may, in some examples, comprise a piezoelectric material. In such examples, the method 800, 900, may further comprise applying a voltage to the piezoelectric material to cause the deflector arm 204 to move between the first deflection configuration and the second deflection configuration.

Figure 10:
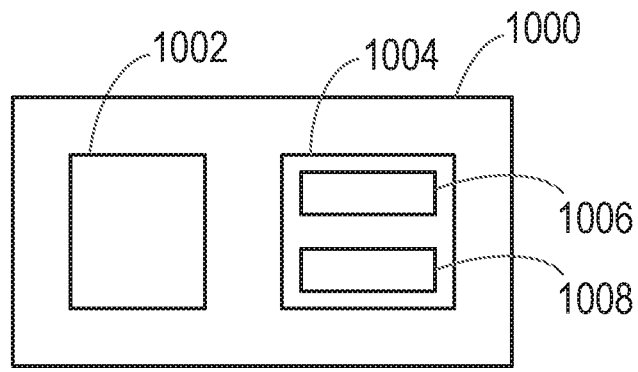
FIG. 10 is a simplified schematic of an example of a print apparatus.

The present disclosure also relates to a print apparatus. The print apparatus may, for example, comprise the substance displacement apparatus 200 disclosed herein. FIG. 10 is a simplified schematic of an example of a print apparatus 1000. The print apparatus 1000 comprises a roller 1002 having a surface on which to receive a substance to be transferred to a printable medium. The print apparatus 1000 also comprises a gas delivery unit 1004 for directing gas towards the roller. The gas delivery unit 1004 may comprise a gas outlet 1006; and a gas deflector 1008 moveable between a first position in which gas is directed from the gas outlet away from a target area on the roller surface, and a second position in which gas is directed from the gas outlet towards the target area on the roller surface, thereby to displace at least some of the substance from the target area of the roller surface. The gas delivery unit 1004 may, in some examples, comprise, or be similar to, the substance displacement apparatus 200.

The print apparatus 1000 may comprise any type of print apparatus which includes a roller for receiving a substance, such as print agent, primer, ink, varnish, or the like. In some examples, the roller may comprise an anilox roller, for use in a flexographic print apparatus.

Figure 11:
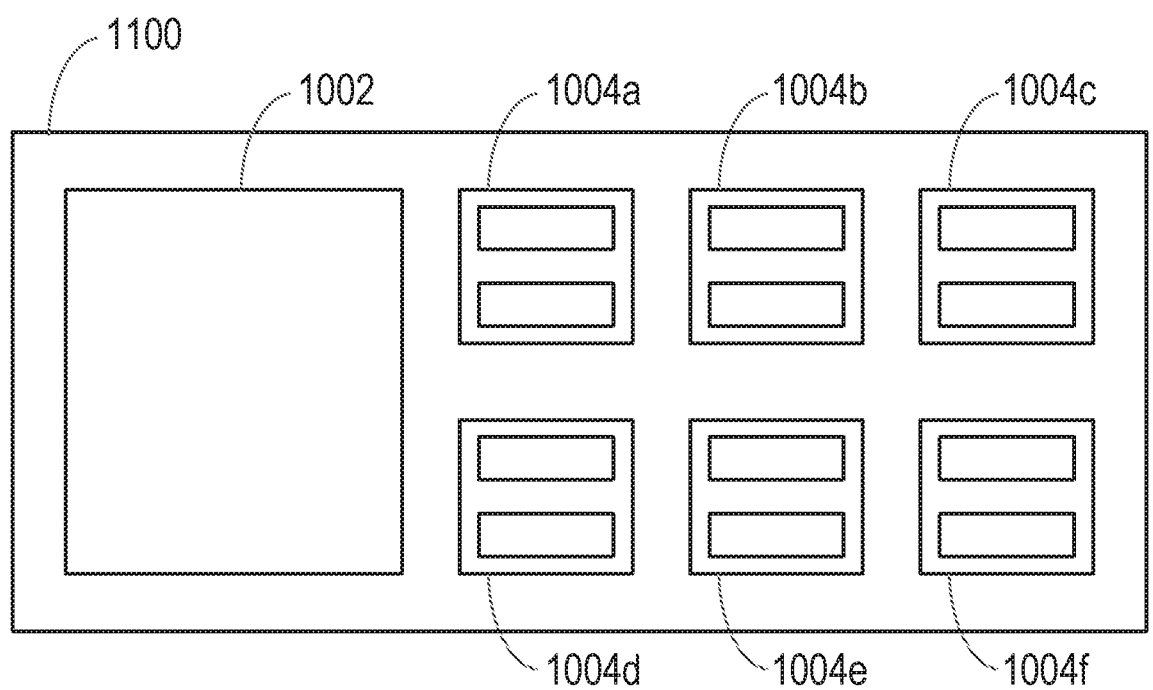
FIG. 11 is a simplified schematic of a further example of a print apparatus.

As noted above, the substance displacement apparatus 200, for the gas delivery unit 1004, may, in some examples, be combined with other similar units. FIG. 11 is a simplified schematic of a further example of a print apparatus 1100 which includes multiple gas delivery units. The print apparatus 1100 includes the roller 1002, and may further comprise a plurality of gas delivery units 1004a to 1004f, each having a gas outlet and a gas deflector, the plurality of gas delivery units arranged linearly over a length of the roller. In the example shown in FIG. 11, the print apparatus 1100 includes six gas delivery units 1004a to 1004f. However, in other examples, the print apparatus 1100 may include more or fewer gas delivery units. As will be apparent from the discussion above, each gas delivery unit may include multiple gas deflectors. For example, each gas delivery unit may include 70 gas deflectors, each gas deflector having a width of 1 mm. A print apparatus may, in some examples, include 10 gas delivery units. Therefore, such a print apparatus may include 700 gas deflectors with a resolution of 1 mm. Each gas deflector may be individually controllable such that the precise area of the roller from which a substance is to be displaced can be accurately controlled. Thus, in some examples, the gas deflector 204 of each gas delivery unit 1004 may be movable independently of the gas deflector of each other gas delivery unit.

The present disclosure is described with reference to flow charts and/or block diagrams of the method, devices and systems according to examples of the present disclosure. Although the flow diagrams described above show a specific order of execution, the order of execution may differ from that which is depicted. Blocks described in relation to one flow chart may be combined with those of another flow chart.

While the method, apparatus and related aspects have been described with reference to certain examples, various modifications, changes, omissions, and substitutions can be made without departing from the spirit of the present disclosure. It is intended, therefore, that the method, apparatus and related aspects be limited only by the scope of the following claims and their equivalents. It should be noted that the above-mentioned examples illustrate rather than limit what is described herein, and that those skilled in the art will be able to design many alternative implementations without departing from the scope of the appended claims. Features described in relation to one example may be combined with features of another example.

The word "comprising" does not exclude the presence of elements other than those listed in a claim, "a" or "an" does not exclude a plurality, and a single processor or other unit may fulfil the functions of several units recited in the claims.

The features of any dependent claim may be combined with the features of any of the independent claims or other dependent claims.

The invention claimed is:

1. A substance displacement apparatus comprising:
   a gas ejection aperture to direct gas towards a roller having a surface on which a substance is disposed;
   a deflector arm moveable between a first position in which gas is directed away from a target area on the surface of the roller, and a second position in which gas is directed towards the target area on the surface of the roller, thereby to displace at least some of the substance from the surface of the roller within the target area; and
   a gas guide element positioned relative to the gas ejection aperture to guide gas which is directed away from the target area away from the roller.

2. A substance displacement apparatus according to claim 1, wherein the deflector arm is substantially planar in shape.

3. A substance displacement apparatus according to claim 1, wherein the deflectable arm is formed from a piezoelectric material.

4. A substance displacement apparatus according to claim 1, wherein the gas guide element comprises a lip to prevent gas which is directed away from the target area from flowing towards the target area after ejection.

5. A substance displacement apparatus according to claim 1, further comprising:
   a substance guide element positioned relative to the gas ejection aperture to guide gas which is directed towards the target area, and the substance removed from the target area, away from the roller.

6. A substance displacement apparatus according to claim 1, further comprising:
   a chamber either side of the deflector arm, each chamber to hold gas prior to ejection via the gas ejection aperture.

7. A substance displacement apparatus according to claim 1, wherein the deflector arm extends at least partially through the gas ejection aperture, and wherein a gap through which the gas is directed has a width of less than approximately 100 micrometres.

8. A substance displacement method comprising:
   directing gas from a gas outlet towards a surface of a roller, the surface having a substance disposed thereon;
   selectively moving a deflector arm between a first deflection configuration in which gas is directed away from a defined region on the surface of the roller, and a second deflection configuration in which gas is directed towards the defined region on the surface of the roller, thereby to displace some or all of the substance from the surface of the roller within the defined region; and
   guiding gas which is directed away from the target area away from the roller utilizing a gas guide element.

9. A substance displacement method according to claim 8, further comprising:
   directing gas into a first chamber located at a first side of the deflector arm and a second chamber located at a second side of the deflector arm, the first and second chambers to store the gas prior to being directed from the gas outlet.

10. A substance displacement method according to claim 9, wherein gas is directed into the first and second chambers so as to maintain a gas pressure in the first chamber which is approximately equal to a gas pressure in the second chamber.

11. A substance displacement method according to claim 8, wherein the deflector arm comprises a piezoelectric material, and wherein the method further comprises:
   applying a voltage to the piezoelectric material to cause the deflector arm to move between the first deflection configuration and the second deflection configuration.

12. A print apparatus comprising:
   a roller having a surface on which to receive a substance to be transferred to a printable medium;
   a gas delivery unit for directing gas towards the roller, the gas delivery unit comprising:
   a gas outlet;
   a gas deflector moveable between a first position in which gas is directed from the gas outlet away from a target area on the roller surface, and a second position in which gas is directed from the gas outlet towards the target area on the roller surface, thereby to displace at least some of the substance from the target area of the roller surface; and
   a gas guide element positioned relative to the gas outlet to guide gas which is directed away from the target area away from the roller.

13. A print apparatus according to claim 12, further comprising:
   a plurality of gas delivery units, each having a gas outlet and a gas deflector, the plurality of gas delivery units arranged linearly over a length of the roller.

14. A print apparatus according to claim 13, wherein the gas deflector of each gas delivery unit is moveable independently of the gas deflector of each other gas delivery unit.

\* \* \* \* \*